United States Patent [19]

Hendel et al.

[11] Patent Number: 5,360,524
[45] Date of Patent: Nov. 1, 1994

[54] METHOD FOR PLANARIZATION OF SUBMICRON VIAS AND THE MANUFACTURE OF SEMICONDUCTOR INTEGRATED CIRCUITS

[76] Inventors: Rudi Hendel, 26 Ridge Rd., Summit, N.J. 07901; Hyman Levinstein, 132 Robbins Ave., Berkeley Heights, N.J. 07974

[21] Appl. No.: 47,265

[22] Filed: Apr. 13, 1993

[51] Int. Cl.$^5$ .............................................. C23C 14/00
[52] U.S. Cl. .......................... 204/192.25; 204/298.02; 437/203
[58] Field of Search .................... 204/192.25, 192.15, 204/298.01; 437/203

[56] References Cited

U.S. PATENT DOCUMENTS

| | | | |
|---|---|---|---|
| 4,657,628 | 4/1987 | Holloway et al. | 204/192.32 |
| 4,661,228 | 4/1987 | Mintz | 204/192.25 |
| 4,816,126 | 3/1989 | Kamoshida et al. | 204/192.3 |
| 4,865,712 | 9/1989 | Mintz | 204/298.16 |
| 4,970,176 | 11/1990 | Tracy et al. | 437/187 |
| 4,994,162 | 2/1991 | Armstrong et al. | 204/192.15 |
| 5,071,791 | 12/1991 | Inoue et al. | 437/203 |
| 5,108,570 | 4/1992 | Wang | 204/192.3 |

OTHER PUBLICATIONS

Taguchi et al: Quarter Micron Hole Filling With SiN Sidewalls by Aluminum High Temperature Sputtering, Jun. 9–10, 1992 VMIC Conference, pp. 219–225.

*Primary Examiner*—Anthony McFarlane

[57] ABSTRACT

Submicron vias are filled by sputter deposition of a conductor such as aluminum onto a substrate such as silicon or silicon oxides. The deposited aluminum film is deposited at a first lower temperature and then the temperature is increased. The differential coefficient of thermal expansion of the substrate relative to the metal conductor forces the conductor to expand into the via. Maintaining an effective thickness and controlling the temperature increase from the first temperature to the second temperature, effectively and reliably fills submicron vias having aspect ratios up to 4. The present invention is particularly useful with filling vias having re-entrant angles of up to 20°.

13 Claims, 6 Drawing Sheets

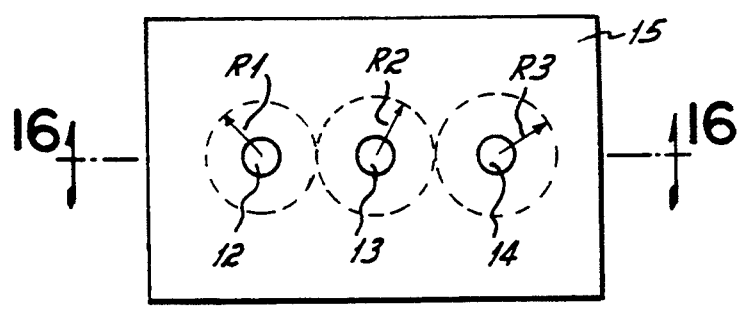
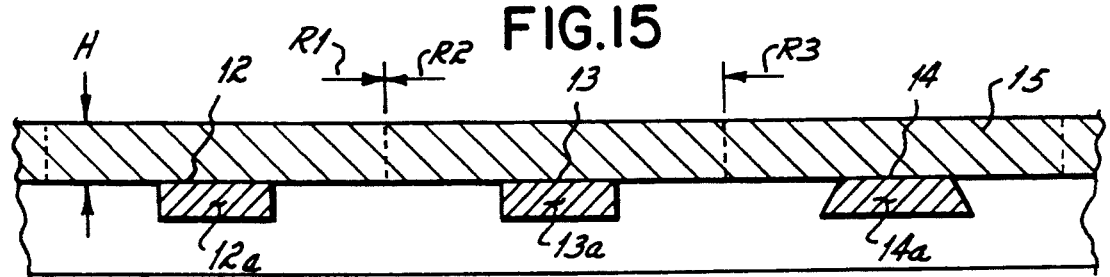

METHOD FOR PLANARIZATION OF SUBMICRON VIAS AND THE MANUFACTURE OF SEMICONDUCTOR INTEGRATED CIRCUITS

BACKGROUND OF THE INVENTION

The active switching elements of integrated circuits are interconnected by metal lines deposited by various methods such as physical vapor deposition, chemical vapor deposition and evaporation. Typically, several levels of metal lines are used in an integrated circuit to allow crossovers. At certain locations, electrical contact is made between lines of different levels. Such locations are called vias.

The drive of integrated circuits to submicron geometry results in vias of extreme aspect ratio and size. Processes used to define those vias do not allow for the reliable control of via sidewalls. Undercut or sloped re-entrant profiles are often observed. Wafers which show such profiles have to be discarded because reliable interconnections through those vias are not possible, thus effecting wafer line yield.

The most commonly used interconnecting metal for high aspect ratio vias is the tungsten plug deposited by the decomposition of tungsten hexafluoride on the sidewall of the via. Such plugs are formed by either selective deposition which has not been reliable enough to be used for manufacturing purposes or by the blanket deposition of a film with successive etch back. All tungsten depositions require the prior deposition of an adhesive layer which is typically a layer of plasma vapor deposited titanium nitride. The titanium nitride deposition may result in a re-entrant profile particularly on geometries with high aspect ratios. The resulting chemical vapor deposition then shows the well known keyhole which results in integrated circuit reliability problems and limits the use of tungsten chemical vapor deposition to critical geometries of greater than 0.5 microns.

In addition to the process difficulties, tungsten chemical vapor deposition processes are complex and expensive. Due to the high resistivity of tungsten, material contact resistances and via resistance are high and can limit the performance of integrated circuits.

The use of aluminum as a material for filling interconnecting vias between integrated circuit metal lines and between the first layer of metal and the semiconductor surface has been proposed utilizing surface diffusion to move materials into the via at temperatures of approximately 450° C. This is disclosed, for example, in Armstrong U.S. Pat. No. 4,994,162. This uses a low temperature seed layer providing a continuous high quality diffusion path for subsequently deposited material to diffuse along. A high temperature low deposition rate step to allow efficient surface diffusion into the feature is employed followed by a high temperature high deposition rate step to complete the deposition.

This process requires a continuous diffusion path along the sidewall of the via and is dependent on achieving certain process conditions simultaneously. These conditions are sometimes difficult to achieve and control.

Bulk diffusion as a mechanism for via filling has been proposed by Sugano et al in the 1992 VMIC Conference Proceedings "Quarter Micron Whole Filling With SiN Sidewalls By Aluminum High Temperature Sputtering." With the Sugano process, the driving force for via filling is the interface between a titanium surface layer and the deposited aluminum. This process requires the presence of a continuous and high quality titanium surface layer on the sidewall of a via.

Tracy U.S. Pat. No. 4,970,176 discloses deposition of a relatively thick layer of aluminum at a first temperature and a subsequent deposition of a thin layer of aluminum at a higher temperature. The specification indicates that the temperature increase acts to reflow the aluminum through grain growth and recrystallization. As shown from the specification, the filling of the via starts from the bottom of the via and works up to the top. At the time the Tracy application was filed, typically the vias were of a size greater than one micron.

Inoue U.S. Pat. No. 5,071,791 discloses heating a substrate water while depositing aluminum and subsequent rapid freezing in order to avoid silicon formation that can precipitate from the aluminum. Basically this is a bulk diffusion process. Further, Kamoshida U.S. Pat. No. 4,816,126 discloses bias deposition of aluminum film. And, Wang U.S. Pat. No. 5,108,570 discloses sputter coating an initial layer of 2000 angstroms and a subsequent layer at a higher temperature for about 30 to 45 seconds. The background indicates that the vias can be as small as 1.5 microns. None of these patents disclose methods which would be effective to fill submicron vias having aspect ratios greater than 1. Further, these methods are generally relatively complex requiring critical control of reaction conditions.

SUMMARY OF THE INVENTION

The present invention is premised on the realization that submicron vias can be effectively and reliably filled by sputter deposition of aluminum.

More particularly, the present invention utilizes via filling by extrusion. According to this method, aluminum is sputter deposited over a via at a first temperature. It is then put into compression by the addition of thermal energy. When the film is heated sufficiently, and assuming an effectively thick initial aluminum deposition, it will plasticly deform and be forced into the via. The temperature of plastic deformation is characteristic for the deposited alloy, its co-efficient of thermal expansion, as well as the substrate and its co-efficient of thermal expansion.

By depositing an effective thickness of a metal layer over the via, and raising the temperature sufficiently high to force the metal to extrude and fill the via, very reliable, complete via filling can be attained.

The invention will be further appreciated in light of the following derailed description and drawings in which:

BRIEF DESCRIPTION OF DRAWINGS

FIG. 15 is an overhead diagrammatic view of an integrated circuit with a plurality of vias; and FIG. 16 is a cross section of FIG. 15 taken at lines 16—16.

DETAILED DESCRIPTION

Figure 1:
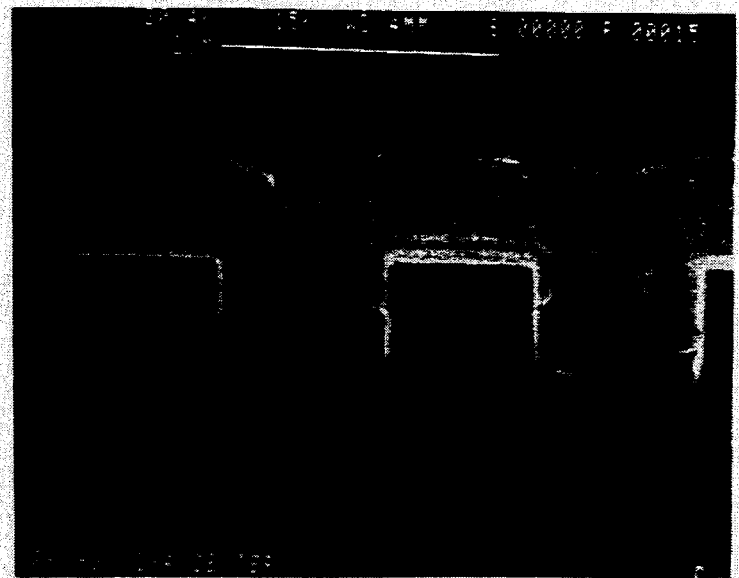
FIG. 1–14 are scanning electronic microscope photographs of the cross-section of a semiconductors with aluminum sputter deposited into vias.

The present invention is a method of filling vias, particularly those having submicron diameters, where the aspect ratio of the via, that is the height to diameter ratio is from about 1 to about 4. In practicing the present invention, aluminum will be deposited into vias having diameters from 0.7 to about 0.1 micron preferably 0.5 to 0.25 micron. According to this method, a substrate which includes one or more vias is initially coated with an aluminum or aluminum alloy layer. The aluminum layer is put into compression by increasing the wafer temperature. The difference in coefficients of thermal expansion between the substrate and the aluminum forces the aluminum into compression. The compressive force will cause the aluminum to flow into and fill the via.

Typically, the substrates for use in the present invention will include silicon layers, boron arid phosphorus doped silica, thermal oxide and TEOS oxide. The coefficients of thermal expansion of these materials is shown in Table 1.

TABLE 1

| Silicon | 3.24 [ppm/°C.] |
|---|---|
| Boron and Phosphorus doped silica | 0.5-0.6 [ppm/°C.] |
| Quartz | 0.55 [ppm/°C.] |
| $Si_3Ni_4$ | 1.5-1.6 [ppm/°C.] |

The thermal expansion co-efficient of most glasses used should be about equal to that of quartz.

Aluminum or an aluminum alloy is sputter deposited on the substrate. In addition to aluminum, aluminum alloys such as Al Si (1%), Al Si (1%)-Cu (0.5%), Al-Cu (1%) and Al-Ti (0.15%) can be used. Due to the high concentration of aluminum, all of these alloys will have a coefficient of thermal expansion of about 24 [ppm/°c].

Depositing an effectively thick layer of aluminum or aluminum alloy at a low temperature is critical for practicing the present invention. As shown in FIGS. 15 and 16, a substrate 11 having three vias 12, 13, 14 is coated by the aluminum layer 15 having a thickness or height of H. The volume 12(a), 13(a) and 14(a) of the vias is shaded. Each via has an available radius of aluminum which is approximately equal to onehalf the distance to the next adjacent via measure focus to focus. This is shown as R1, R2, and R3 in FIG. 15. Thus, there is a cylinder of aluminum defined by the radius and thickness H which is equal to $2\pi R^2 H$ which is available to develop the necessary compressive stress required to extrude the aluminum necessary to fill the volume of the via.

After deposition of the aluminum on the water, the temperature will be increased. To fill the via, the cylinder times the differential thermal expansion between the substrate and the aluminum layer must be at least equal the volume of the via. Upon heating the deposited aluminum, the increase in volume of the available aluminum caused by the change in temperature should equal the void volume of the via. To completely fill a via having a volume of 0.8 cubic microns there must be an available radius of 7 microns if the film thickness is 1 micron and the temperature change is 100° C. This assumes that the substrate is silicon and the metal is aluminum. If the via to be filled has a volume of only 0.2 cubic microns, an available radius of 3 microns for a film thickness of 1 micron is required. If the temperature rises 200°, then the respective radii are 3.7 microns and 1.5 microns, respectively.

The available radius limits the material available for via filling by extrusion and thus restricts the density of vias this process will support. The values shown apply to most, if not, all practical integrated circuits. Should higher densities be required, the film thickness of the deposited aluminum can be increased. This increases the amount of material available for filling the via by extrusion and thus reduces the radius proportionally. Highly dense arrays of via holes with large volumes can be filled by the deposition of a thicker layer which after the extrusion process can be etched back to nominal thickness.

With these limitations in mind, the following is a more detailed description of the actual deposition process.

Preferably the present invention will be conducted in a multichambered sputtering unit which would include an etching chamber and two or more sputtering chambers. One such machine is Eclipse brand sputtering system sold by Materials Research Corporation (also referred to in U.S. Pat. No. 4,994,162). Other commercially available systems are equally suitable.

In the first chamber, the substrate can be initially etched to remove surface impurities. Heating of the substrate also assists in removal of outgases. This is optional but preferred. The substrate is then moved to the second chamber.

In the second chamber, a barrier layer can be applied if desired. A preferred barrier is TiN although ZrN and $RuO_2$ barrier layers can also be used. However, barrier layers may not be required in all applications. Generally the thickness of the barrier layer will be about 1000 to about 2000 Angstroms. If the original via sidewalls are normal to the wafer surface, then this establishes a slight inwardly (negative) sloped re-entrant profile at the via. This sloped or undercut re-entrant profile facilitates movement of the aluminum into the via under compression. Basically it decreases the opening so that the initial aluminum layer covers the opening without filling it. The larger the via the thicker the barrier layer and initial aluminum layer should be. But, the opening should not have a radius less than 0.1 microns. Further, it is preferred to have an inward re-entrant profile of 0° to 20° and preferably 5°-10°. The barrier layer assists in forming this.

In a third chamber, the substrate is cooled to about room temperature. It is then transferred to a final chamber where the aluminum is deposited.

Using this equipment, it is preferred to deposit a thick layer 2000 to 5000 angstrom of aluminum initially at a temperature of about 20°-50° C. with sputter power of about 3-15KW. A bias voltage may be applied if desired, but is not necessary. Once this first thick layer of aluminum is deposited, the substrate and aluminum are subsequently heated to a temperature which forces the aluminum to expand relative to the substrate. In order to provide a relatively smooth surface, it may be desirable to continue the deposition of aluminum during the heating phase. This heating can be accomplished by admitting a gas between a heated surface near the wafer. The gas transfers the heat from the backplane to the wafer, increasing the wafer temperature. In addition, the wafer is heated by the heat of condensation of additional aluminum deposited.

It is further important to provide sufficient time for the stress caused by this temperature increase to be released. Generally, maintaining the elevated temperature for 1-10 minutes permits adequate stress release and thus via filling.

Figure 2:
Figure 3:
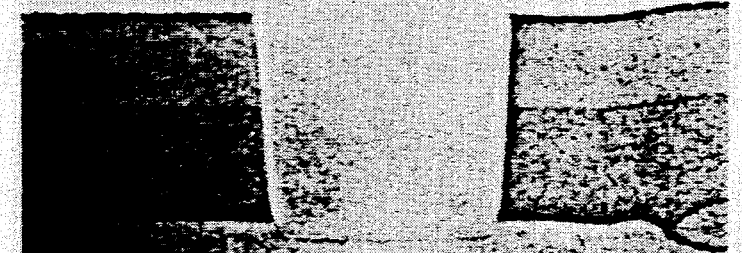

FIGS. 1-12 show various vias filled under various parameters to demonstrate successful and tailed attempts. FIG. 1 shows a closely spaced pattern with apparent voids. This figure of unsuccessful planarization demonstrates two facts that 1) via filling is not through a continuous film along the sidewalls and from the bottom up, but occurs from the top down filling an already existing void, and 2) very high pattern density does not allow sufficient stress to develop to completely fill the via. FIGS. 2 and 3, however, show successful planarization in vias spaced further apart.

The vias in the substrate, as shown in FIG. 2, were filled by initially etching the wafer surface at 500° C. for 120 seconds with argon gas, (50 SCCM), (gas pressure 4.7 millitores). In addition to surface cleaning, this step is intended to desorb water which may be present in the film. In a second chamber, the wafer was coated with a TiN barrier coating. With a back plane temperature of 300° C., a 350 angstrom film was applied with 50 SCCM argon gas flow and 2.2 SCCM nitrogen gas flow (applied voltages of 3KV). In the second step, lasting five seconds, 20 SCCM of argon was introduced while the back plane gas was maintained and 27 SCCM of nitrogen gas admitted. Finally, in the third step, 800 angstroms TiN was applied with a DC power of 6KV, for 33 seconds. (The argon admitted at 20 SCCM.)

In the third chamber, this wafer was cooled down over 120 seconds with back plane and therefore back plane gas at room temperature. The wafer could be actively cooled in this chamber using a refrigerated gas. Rapidly cooling the wafer to $0° + -40°$ C. over 120 seconds can enhance the end product. Finally, in the fourth chamber, an initial aluminum layer of 2500 angstroms was applied with a DC power of 11.0 KV over 12 seconds with 100 SCCM flow of argon supplied as sputter gas. No back plane gas was admitted. The wafer temperature therefore stayed at approximately 50° C. Over the next 88 seconds with a DC power of 1.7KV, the back plane gas was applied at a temperature of 550° C. During this time, a 3000 angstrom film of aluminum was deposited. The results are shown in FIG. 2.

The results shown in FIG. 3 are obtained in a similar process. Initially the substrate was etched and baked at a temperature of 500° C. The wafer was then coated with a titanium nitride layer approximately 1500 angstroms followed by a cool down step in the third chamber. In the final chamber, a 5000 angstrom aluminum film was applied (over 14 seconds) to the substrate at room temperature (no greater than 50° C.) with a DC power of 11.0KV. Over the next 43 seconds. 3000 angstroms of aluminum was applied with the back plane gas applied at 550° C. In the next step, the DC power was changed to 3.7KV and over a period of 36 seconds (100 SCCM of argon gas), the back plane gas was applied at a temperature of 550° C. During this period, 3500 angstroms of aluminum was deposited.

Figure 4:
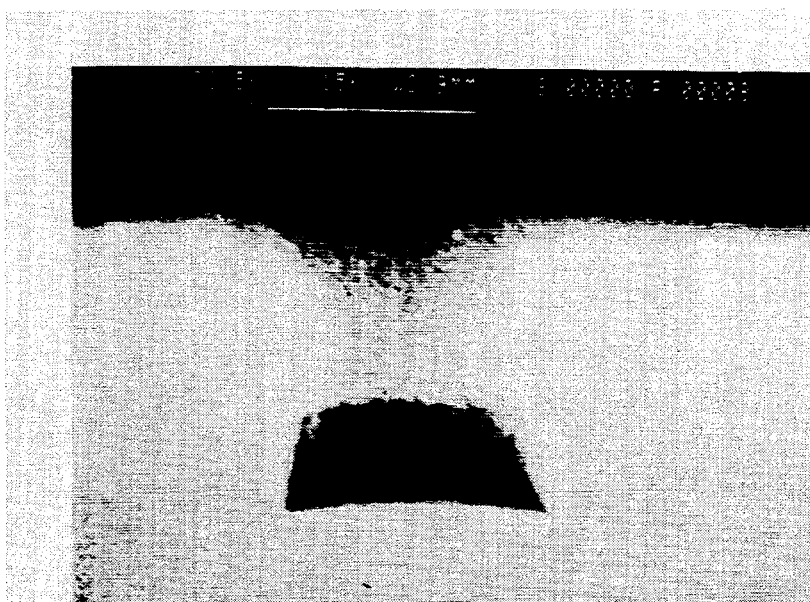

FIG. 4 shows a pattern in silicon dioxide showing a negative slope (inward) re-entrant angle filled by the method of the present invention. Such a structure is impossible to fill entirely with any of the prior art methods.

Figure 5:
Figure 6:

FIG. 5 shows a first unsuccessful attempt to planarize a feature with re-entrant via angle. The pattern is of high density and the final temperature reached is 500° C. The temperature of the initial cold step is approximately 100° indicating a total temperature rise of 400° C. The severity of the pattern, extremely closely spaced, does not allow sufficient stress to develop to effectively fill the via and the via is only half filled. FIG. 6, on the other hand, shows a similarly dense pattern with a final temperature of 550° C. (a 450° C. temperature rise). The filling of the via from the top has clearly progressed and it appears now approximately ⅔ filled.

Figure 7:
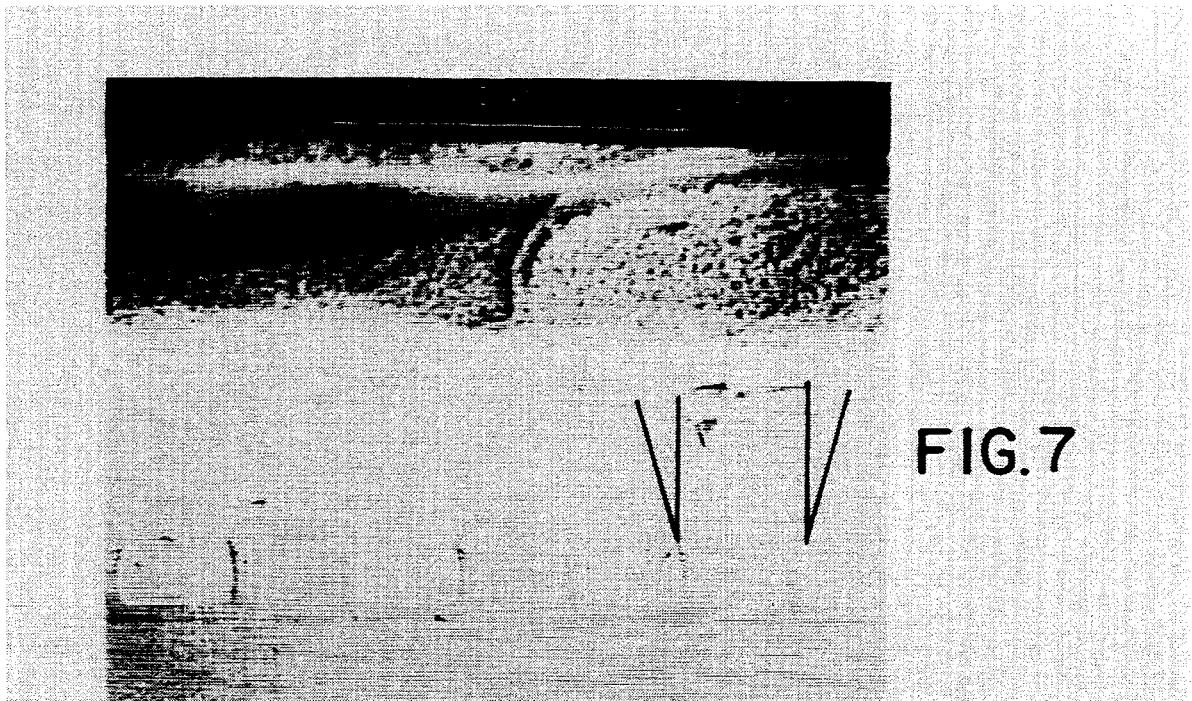
Figure 8:
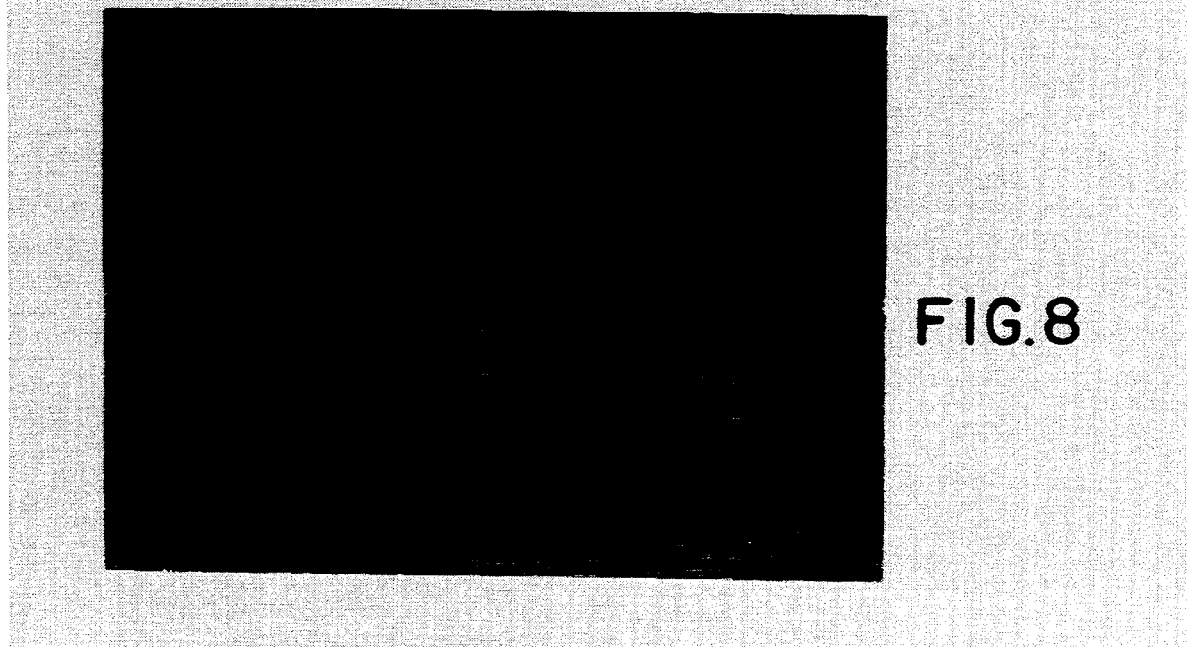

Finally, raising the temperature to 600°, thus a temperature differential of 500° C., shows complete via filling even in the highly dense structure shown in FIGS. 7 and 8. It is notable that the via shown in FIG. 7 has a re-entrant angle of greater than 16° (measured from a line perpendicular to the plane of the substrate) preventing depositing a continuous film along the sidewall. Diffusion along such a sidewall would be disrupted at the film discontinuity and thus impossible using prior art techniques. This technology applies for vias with any re-entrant profile. However, generally it is preferred to have a re-entrant profile of 5° to 10°.

Figure 9:
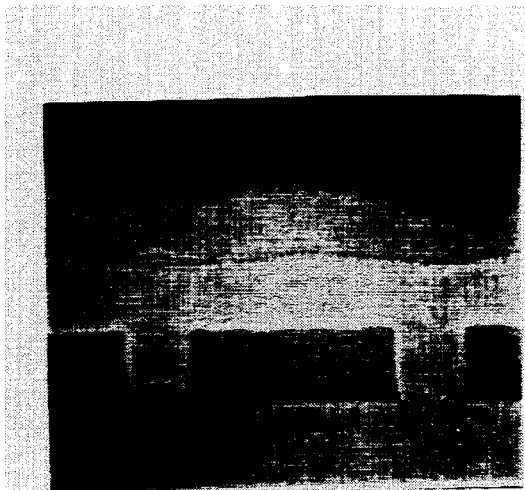
Figure 10:
Figure 11:
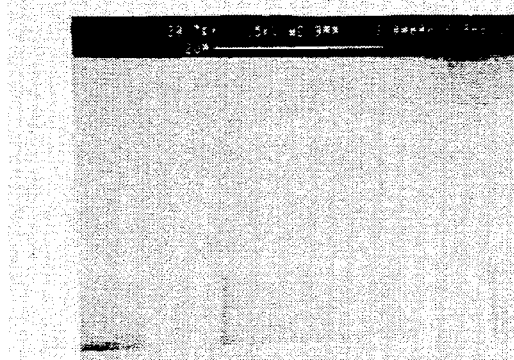

FIGS. 9–11 and 12–14 demonstrate another element of the present invention. FIGS. 9–11 show via filling of less densely spaced small vias (0.6 microns) than shown in FIGS. 5–7 and thus are able to be planarized at lower temperatures (540° C.). An increasing amount of time for stress release may be required in these situations. In filling the via shown in FIG. 9, a hot sputtering time of 50 seconds was employed and a void remained on the very bottom of the via. The via shown in FIG. 10, however, is sputtered for 1 minute and is completely filled. Likewise. as shown in FIG. 11, sputtering for 2 minutes completely fills the via.

Figure 12:
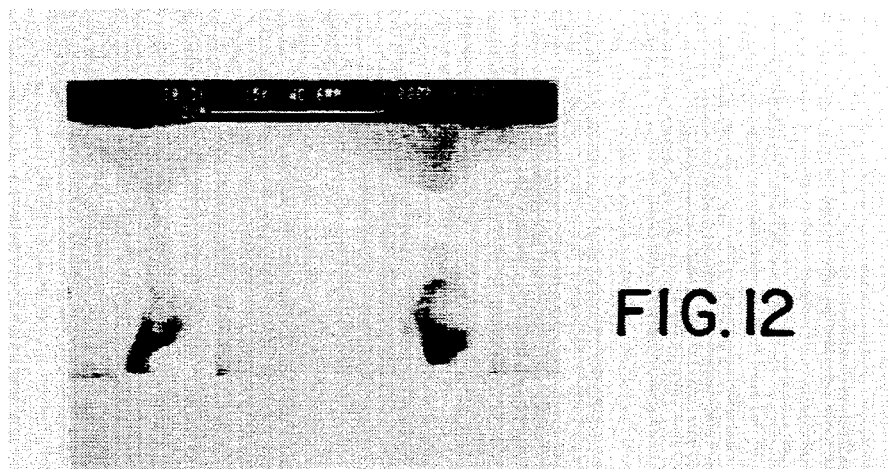
Figure 13:
Figure 14:
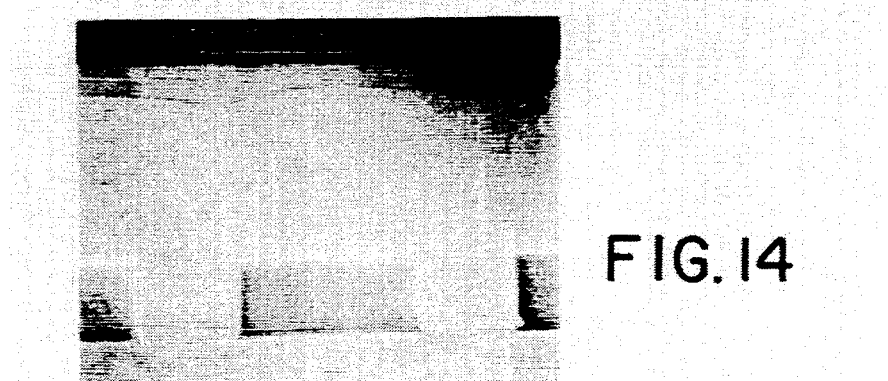

Finally, FIGS. 12–14 show larger vias, 0.8 microns on identical wafers. The vias shown in FIGS. 9 and 12 were processed under identical conditions, likewise the vias shown in FIGS. 10 and 13 and FIGS. 11 and 14. For the larger via, 50 seconds and 1 minute stress release time are insufficient for complete void free via filling. Two minute stress release time completely fills the via. Pattern densities in integrated circuit typically are substantially less dense than shown in these test patterns. Therefore allowing the set-up of adequate stress fields at lower temperatures and shorter heat cycle.

Thus, as demonstrated by these examples, the present invention provides a method to fill vias with sputter deposited aluminum without extreme control of multiple parameters. This is widely adaptable, vias having diameters of 0.1 to 0.8 microns and aspect ratios of 1.0 to 4.0, and having re-entrant profiles from 0° to up to 20°. Thus, the present invention is versatile, reliable and inexpensive. This, of course, has been a description of the present invention as well as the best mode currently known to the inventors of practicing the present invention.

However, the invention itself should be defined only by the appended claims wherein we claim:

1. A method of filling submicron vias in a substrate comprising:

depositing a layer of a metal conductor having a coefficient of thermal expansion on to said substrate at a first temperature wherein said layer covers said vias and leaves a void space in said vias and wherein said substrate has a lower coefficient of thermal expansion than the metal conductor; heating the substrate and the deposited conductor to a second temperature wherein the layer of the deposited metal conductor is effectively thick so that thermal stress created by increasing the temperature from the first temperature to the second temperature and the relative coefficient of thermal expansions of the conductor and the substrate causes the conductor to expand and uniformly fill the void in said submicron vias, wherein said layer of metal conductor is at least about 2,000 Å.

2. The method claimed in claim 1 wherein said via has a diameter of from about 0.8 to about 0.1 micron.

3. The method claimed in claim 2 wherein said via has an aspect ratio of from about 1 to about 4.

4. The method claimed in claim 2 wherein said via has a re-entrant profile of from about 0° to about 20° measured from a line perpendicular to a plane of said substrate.

5. The method claimed in claim 4 wherein said via has a re-entrant profile of 5° to 10°.

6. The method claimed in claim 1 wherein said metal conductor is selected from the group consisting of aluminum, Al-Si, Al-Cu, Al-Si-Cu and Al-Ti.

7. The method claimed in claim 1 wherein said substrate is selected from the group consisting of silicon, boron and phosphorus doped silica, quartz, TEOS, spin-on glass and $Si_3N_4$.

8. The method claimed in claim 1 wherein a re-entrant profile is established in said vias prior to depositing said metal conductor by sputter depositing a barrier layer.

9. The method claimed in claim 8 wherein said barrier layer is selected from the group consisting of TiN, ZrN, and RuO.

10. The method claimed in claim 1 wherein additional metal is sputtered onto said deposited metal as said conductor is heated.

11. The method claimed in claim 1 wherein said second temperature is maintained for 1 to 10 minutes to provide stress release for said conductor.

12. The method claimed in claim 1 wherein said second temperature is about 400° C. higher than said first temperature.

13. The method claimed in claim 1 wherein said layer of metal conductor is 2,000 to 5,000 angstroms.

* * * * *